INVENTOR
CARL A. JOHNSON
BY Cushman, Darby & Cushman
ATTORNEYS

INVENTOR
CARL A. JOHNSON

BY Cushman, Darby & Cushman
ATTORNEYS

United States Patent Office 3,042,813
Patented July 3, 1962

3,042,813

PULSE DISCRIMINATING AND CONTROL CIRCUIT FOR MULTIVIBRATOR CIRCUITS

Carl A. Johnson, St. Paul, Minn., assignor to Sperry Rand Corporation, New York, N.Y., a corporation of Delaware Filed June 12, 1959, Ser. No. 819,945
20 Claims. (Cl. 307—88.5)

This invention relates generally to multivibrator circuits, and more particularly to circuitry for improving the reliability of such circuits, especially transistorized flip-flops.

The ever expanding utilization and the increased complexity of electronic equipment has led to a determined effort to replace thermionic tubes with components such as transistors to take advantage of their low power consumption, small heat dissipation, miniature size, and lesser likelihood of failure. Recently the greater portion of research on transistors and transistor circuits has been concentrated on the junction type of transistors including surface barrier, diffused junction among other types of junction transistors. Transistors of the junction type are classed into two basic conductivity types. The n-p-n transistor comprises a body of semi-conductive material such as germanium or silicon containing a thin layer of p-type material interposed between zones of n-type material. In the p-n-p transistor, the reverse is true. Ohmic nonrectifying connections are made to each zone with a base connection made to the intermediate zone and emitter and collector connections made respectively to the outer zones.

A basic component of electronic data handling systems is the flip-flop circuit or bistable multivibrator which can be switched alternately between its two conditions of stable equilibrium by means of trigger pulses. If the switching is accomplished by pulses arriving from a single trigger input, the flip-flop becomes a scale-of-two or radix two counter stage and as such is usable as a basic building block in electronic data handling equipment as part of a binary-coded decade counter, accumulator, or the like.

Much effort has been placed in attempting to provide a transistor flip-flop circuit which can be reliably triggered at relatively high repetitive rates by input trigger pulses on a single input line. Generally the objection in such circuits is that the circuit becomes sensitive to pulse width variations, especially in pulses that have become widened after being repeatedly amplified without intermediate pulse forming. If the pulse is too wide both transistors in the flip-flop may become at best partially conductive during the pulse, and the flip-flop is likely to come to rest in either one of its two stable states regardless of what state it was in prior to the application of the input trigger.

Another recurrent problem in electronic data handling systems is the presence of a substandard or "runt" pulse (commonly referred to as a zero or noise signal) causing a flip-flop to switch states thereby giving a false indication that a valid pulse was received.

According to this invention a flip-flop circuit may be reliably switched from one stable state to the second stable state by a single electrical impulse on a common input line. The circuit is made relatively independent of pulse width variations and insensitive to undesirable runt pulses, thus eliminating the need for many pulse forming networks in data handling machines.

Accordingly it is an object of this invention to provide an improved transistorized bistable counting circuit.

It is another object of this invention to provide an improved bistable counting stage which is completely relatively insensitive to increases in pulse widths.

It is still a further object of this invention to provide an improved bistable counting stage which is nonresponsive to runt pulses.

It is still another object of this invention to provide a counting stage which does not switch stable states until cessation of the input trigger.

It is yet another object of this invention to provide a counting stage which discriminates between pulses of high and low voltage-time integrals.

It is still another object of this invention to provide an electronic counter which advances the count upon cessation of the pulses to be counted.

Other objects and advantages of this invention will become apparent to those skilled in the art from a detailed reading of the specification and drawings wherein.

Figure 1:
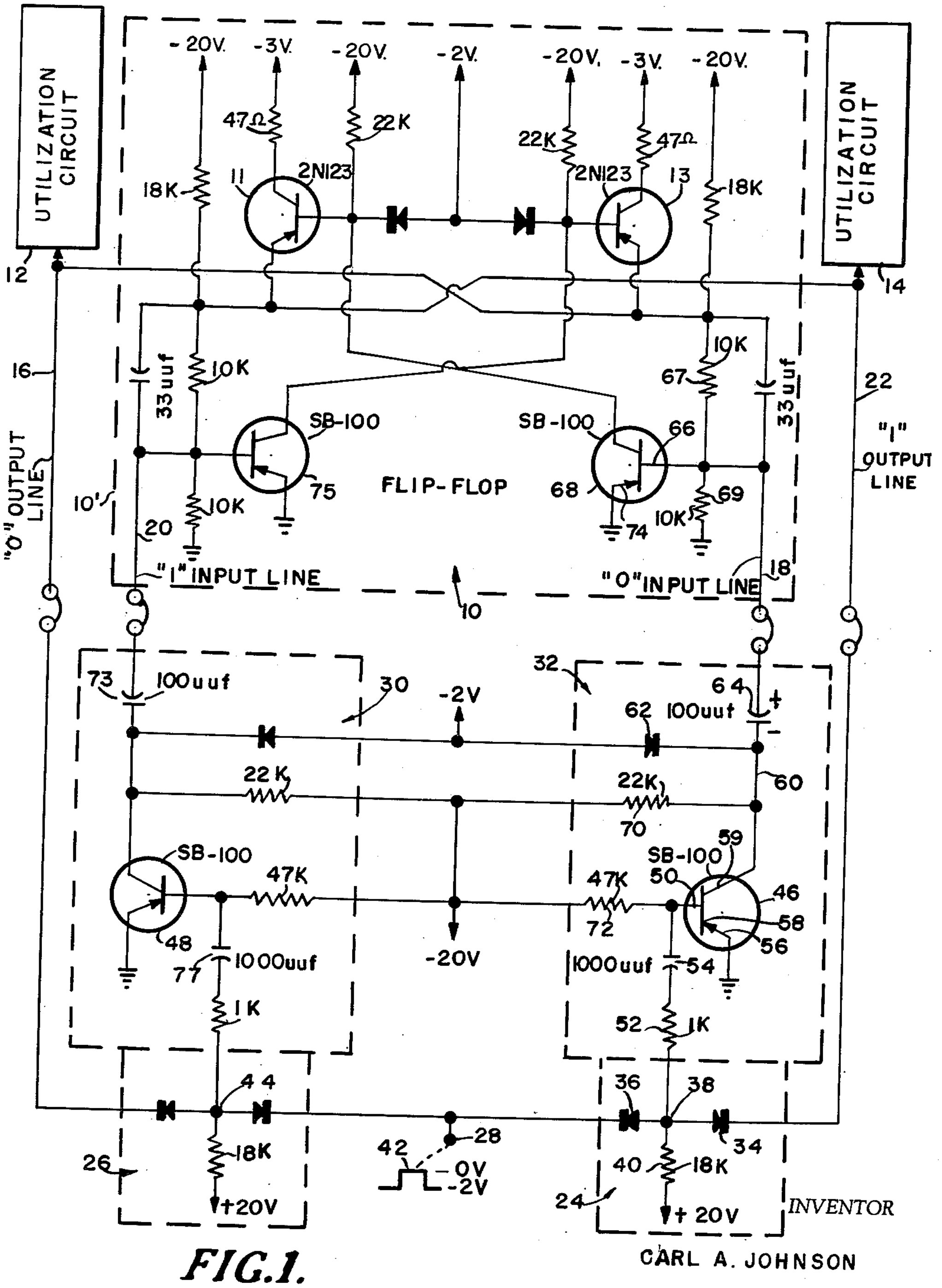
FIGURE 1 is a circuit schematic of the invention.

A transistorized bistable multivibrator, or flip-flop as it is sometimes termed, is shown in box 10 of FIGURE 1 in conjunction with two transistors 11 and 13 connected as emitter followers, and it all operates in the usual manner. In the embodiment of the flip-flop illustrated, with the component values as shown, the output voltages provided to the utilization circuits 12 and 14 are nominally −2 and 0 (ground) volts; thus being compatible, as is generally preferable, with direct-coupled transistorized logic. A description of direct-coupled transistorized logic is given by Beter, Bradley and Brown in "Surface-Barrier Transistor Switching Circuits," IRE Convention Record, part 4, pages 139 ff., New York, 1955.

In the following discussion the term "negative" or "relatively low" voltage refers to the −2 volts, while the term "positive" or "relatively high" voltage refers to 0 volts. By arbitrary definition herein as to any given output line, a "relatively high" voltage thereon is indicative of a predetermined condition or state, while a "relatively low" voltage thereon is indicative of the absence of such a condition or state. As an example, a relatively high voltage on line 16 is indicative that flip-flop 10 is in a "0" state, while a relatively low voltage on line 16 indicates a "1" state for flip-flop 10. The converse is true for output line 22; that is, a relatively high voltage thereon indicates a "1" state for the flip-flop while a relatively low voltage thereon indicates a "0" state therefor. To change the flip-flop from a "0" state to a "1" state, an input signal may be applied over line 20, while an input signal on line 18 may revert the flip-flop back to its "0" state.

To convert flip-flop 10 into a counting circuit, diode AND gates 24 and 26 may be coupled together, to receive trigger pulses at terminal 28, and respectively between an input and output of flip-flop 10. Each time a positive pulse is applied to terminal 28, flip-flop 10 should change state. The left AND gate 26 is coupled to the "1" input line 20, and the right AND gate 24 is coupled to the "0" input line 18. The "0" output line 16 is coupled to one input of the left gate 26, while the "1" output line 22 is coupled to one input of the right gate 24, and the initial trigger input signal terminal 28 is coupled to the other inputs of both gates 24 and 26. These gates or AND circuits are preferably typical logical diode nets. In such a circuit, for example in circuit 24, the inputs thereto are applied to the cathode ends of diodes 34 and 36 whose plate ends are joined to a common junction 38 which is coupled to a relatively very positive voltage source, such as +20 volts, through resistance 40. When the flip-flop output line 22 is relatively high in voltage, junction 38 moves up and down in voltage in correspondence with the voltage excursions of a trigger signal at terminal 28. However, when output line 22 is relatively low in voltage, junction 38 stays at a relatively low voltage regardless of what occurs at terminal 28. The junction 38 voltage is always relatively low unless both inputs to the cathode ends of diodes 34 and 36 are relatively high. This provides a logical AND function indication at junction 38. It may also be said that circuit 24 gates a trigger signal in accordance with the state of flip-flop 10.

If flip-flop 10 is in the "1" state, i.e., if there is a relatively high voltage on line 22, and if at the same time a positive-going trigger pulse 42 is applied to terminal 28, gate 24 provides a positive or relatively high voltage at junction 38, while gate 26 maintains a relatively low voltage at junction 44. When the positive voltage at junction 38 is coupled to line 18, flip-flop 10 switches from the "1" state to the "0" state. Similarly, when line 16 has a relatively high voltage thereon, gate 26 gates a trigger pulse from terminal 28 and the resulting relatively high voltage at junction 44 is coupled to input line 20 to switch flip-flop 10 to the "1" state. Thus it is seen that flip-flop 10 may switch state each time a trigger pulse is applied to the single input terminal 28 regardless of the state of the flip-flop and thus provides a modulo two counter.

The circuitry so far described in detail is conventional and in many situations is not as reliable as desired in that the flip-flop will change state even if there is received at terminal 28 a substandard signal, such as a noise signal, zero signal, or the like and particularly any such signal as does not exist for at least a minimum time. Further, if the trigger signal exists for a time beyond that required to change the state of the flip-flop, it becomes questionable as to in which state the flip-flop will come to rest. In other words, the circuitry so far described in detail is undesirably sensitive to substandard pulses and unreliably dependent on pulse width variations. To overcome these objections, circuits 30 and 32 are added to cause the circuitry of FIGURE 1 to become discriminating as to the pulses which can switch the flip-flop and to give a voltage-time integral range (or pulse width range with constant level voltage) possibility for such pulses so pulse width variations within such range are immaterial.

Circuits 30 and 32 are identical and provide discrimination as to the voltage-time integral of pulses appearing on terminal 28 as well as providing a pulse on either line 18 or 20 only after cessation of the input pulse on terminal 28. Without an input pulse on terminal 28, both transistors 46 and 48 are in a low impedance or conductive state keeping their collector and base voltages essentially at ground reference potential which is the voltage on their respective emitter electrodes.

Upon a positive input to the cathode end of diode 36 of AND circuit 24 when flip-flop 10 is in the 1 state (line 22 positive), the voltage at junction 38 changes from −2 volts to 0 volts. This positive two volt change is transferred to base electrode 50 through limiting resistance 52 and capacitor 54. This two volts on base 50 makes the base electrode voltage positive with respect to the emitter 56 voltage, thereby reverse biasing the emitter-base junction 58 of transistor 46 to make it non-conductive. Transistor 46 switching to a high impedance state tends to cause a −2 volt transient on line 60 as limited by the −2 volt supply through clamp diode 62 which maintains the voltage on line 60 no less negative than −2 volts. This negative transient is passed by capacitor 64 to line 18 and thus to the base electrode 66 of transistor 68. Since transistor 68 already is in a low impedance or conductive state as indicated by the positive voltage on line 22, and additional negative voltage on the base electrode 66 will only tend to make transistor 68 more conductive and will not switch the state of the flip-flop 10.

A small constant current provided from a −20 volt supply through resistance 70 linearly charges capacitor 64 to 2 volts, the polarity thereof being as indicated in FIGURE 1. The charging time constant related to capacitor 64 is basically determined by the values of resistance 70, capacitor 64, and the magnitude of the voltage supplying the constant current, in conjunction with transistor 46, and for the values indicated in FIGURE 1 is about 2.2 microseconds. Thus to charge capacitor 64 to a full two volt charge requires about 0.22 microsecond. This time represents the narrowest 2 volt trigger pulse which is reliably acceptable at terminal 28 by the illustrated embodiment of this invention when using a −20 volt supply through a 22K resistor (resistance 70) to charge a 100 $\mu\mu$f. capacitor 64 to a 2 volt charge, no limitation to such values being intended. Since transistor 68 is in a low impedance state, the impedance to ground from line 18 is negligible with respect to the impedance of charging resistor 70, and since the 2 volt charge is 0.1 of the supply voltage of 20 volts, the charging is substantially linear with respect to time.

In the embodiment of FIGURE 1, the input pulse from AND circuit 24 is A.C. coupled to transistor 46 by capacitor 54, the value of which in conjunction with the value mainly of resistance 72 determines the time constant associated with the input circuit of transistor 46. Since the signal amplitudes are 2 volts, the time for capacitor 54 to charge after an input transient, is 4.7 microseconds if one neglects the negligible leakage current of transistor 46. Thus, following the leading edge of pulse 42, capacitor 54 is capable of maintaining transistor 46 in a high impedance (non-conductive) state for 4.7 microseconds and will do so if trigger pulse 42 lasts that long. Transistor 46 reverts to its low impedance (conductive) state at the time trigger pulse 42 ends if it lasts less than 4.7 microseconds, or at the end of 4.7 microseconds if the trigger pulse endures that long or longer. Therefore, upon receipt at terminal 28 of any trigger pulse which exists for at least 0.22 microsecond, flip-flop 10 switches (in the manner below described) to its "0" state at least at the end of 4.7 microseconds and earlier if the trigger pulse ends earlier.

To prevent triggering back to the "1" state, if such is desired, the trigger pulse should cease before 4.92 (4.7+0.22) microseconds assuming the time constant associated with capacitor 73 is the same as capacitor 64, 0.22 microsecond in keeping with the example. Further, if it is desired to trigger the flip-flop twice, but not thrice, the trigger pulse should have a duration between 4.92 microseconds and 9.62 (4.7+4.7+0.22) microseconds assuming the time constant associated with capacitor 77 is 4.7 microseconds as assumed for capacitor 54 (the 0.22 microsecond in the summation being the extra time which would be required for a third switching, i.e., back to the "1" state). Thus, the minimum and maximum pulse widths for single and double switchings, along with the minimum pulse width for triple switching, are defined, with it having been tacitly assumed that switching from one state to another is intsantaneous. Although it has been indicated that the corresponding time constants in circuits 30 and 32 are the same, it is to be understood that such is not an essential and can be different if desired to cause different minimum pulse widths to be required to switch to one state than the other, and/or to obtain different width output pulses to circuits 12 and 14 especially when a relatively high potential (zero volts in the example) is maintained at terminal 28 for continuous switching or oscillation of the flip-flop.

By shorting out or removing capacitor 54 from the circuit, the sensitivity to maximum pulse width can be removed, thereby allowing the trigger pulse to exist longer than 4.92 microseconds without causing double switching, since the non-conductive hold time for transistor 46 would then be equal to the trigger pulse width at all times. Under such conditions, the value of resistor 52 should be increased (for example, to 2.7K ohms) to insure conduction of transistor 46 during the absence of a trigger pulse. The same can be done for the input circuit of transistor 48 if desired.

Upon cessation of positive trigger pulse 42, the voltage at junction 38 changes suddenly to a negative value providing a −2 volt transient to base 50 through capacitor 54. The transient causes transistor 46 to resume a low impedance (conductive) state in which it is then held by the −20 volt supply through resistor 72 providing a current path for the emitter-base current of transistor 46.

Upon transistor 46 assuming a low impedance (conductive) state the voltage on line 60 suddenly changes from about −2 volts to near ground potential causing a positive 2 volt transient. Since the collector-to-emitter impedance of transistor 46 when conductive is quite small (of the order of 1 ohm) capacitor 64 discharges very rapidly causing on line 18 a positive two volt transient which neutralizes the effective forward bias charge across the base-emitter junction of transistor 68. The input signal on line 18 is thus always a standard pulse (i.e., always the same size) regardless of pulse variations on terminal 28 as long as the trigger pulses endure at their 2 volt amplitude for at least the minimum time (0.22 microsecond in the example). The positive transient or input signal on line 18 makes the base 66 potential positive with respect to the emitter 74 potential which reverse biases the emitter-base junction of transistor 68. As is well known, transistor 68 then begins assuming a high impedance (non-conductive) state to initiate the switching of flip-flop 10 in the usual manner.

The voltage-time integral discriminating capabilities of circuit 32, for example, comes about as follows. During the non-conducting duration of transistor 46, i.e., during the existence of trigger pulse 42, capacitor 64 is allowed to charge up to −2 volts (line 60 is then at approximately −2.3 volts while line 66 is at approximately −0.3 volt), thereby basically generating the input signal for transistor 68, but of the wrong polarity. Upon cessation of trigger pulse 42, line 60 is clamped to ground through transistor 46 rather than to −2 volts through diode 62. This switching of line 60 allows capacitor 64 to discharge through the base-emitter circuit of transistor 68 in such a polarity that the previously injected carriers (forward bias) are cancelled and transistor 68 assumes a non-conducting state. If capacitor 64 had only been partially charged, i.e., if trigger pulse 42 were narrow, to a point less than the effective charge of the excess injected carriers, transistor 68 would not have assumed the cut-off state, and the flip-flop would not change state. Since the changing of state of the flip-flop is dependent on developing a minimum accumulated charge on capacitor 64 during the trigger pulse time, and the charge is approximately linearly dependent on the charging duration and the charging duration is approximately equal to the trigger pulse width, it follows that the changing of state of the flip-flop is dependent upon the minimum trigger pulse width. With direct coupled logic, the signals are clamped either to ground or another voltage level, in this case to −2 volts, which results in constant voltage amplitude signals. It follows then that the flip-flop with its added circuits 30, 32 is voltage-time integral discriminating, with the minimum pulse width acceptable being determined in reality not only by the values of capacitor 64, registor 70, and their supply voltage, but also by the effective $r_b$ of transistor 68, the values of resistors 67 and 69, and the effective stored charge in the base-emitter junction of transistor 68 due to excess injected carriers.

Circuits 30 and 32 are also voltage-time integral discriminating in the sense above stated relative to the maximum size trigger pulse usable at terminal 28, for single switching for example. That is, since pulse 42 is of constant voltage and since that pulse may be of no greater width than the sum of the times related to the time constants associated with condensers 54 and 73 (or 77 and 64) and the supply voltage (−20 volts), without the flip-flop being switched twice, discrimination as to the maximum usable voltage-time integral of trigger pulse results.

Thus there is shown a bistable counting circuit which provides pulse width discrimination and initiation of the switching action of the bistable circuit with a standard pulse after cessation of the trigger pulse.

Figure 2:
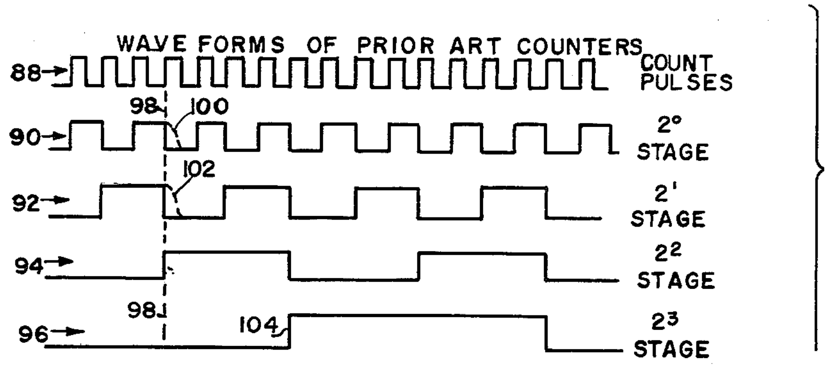
FIGURE 2 is a sketch of waveforms associated with a typical electronic counter.

The advantage of utilizing this invention in counting circuits and the like will now be described with reference to the idealized waveforms in FIGURES 2 and 3. It is well known that the switching action of prior art flip-flops are initiated immediately upon presentation of a trigger pulse to the grid of a thermionic tube or base of a transistor. Such switching action is represented in the waveforms of FIGURE 2 which shows voltage indications for four binary counter stages, $2^0$ through $2^3$ inclusive. Count pulses 88 cause a counter, such as logically illustrated in FIGURE 4 (i.e., circuits 76—82 are only conventional flip-flops rather than with the addition of circuits 30 and 32 of FIGURE 1), to advance count. The type of counter logically illustrated in FIGURE 4 is well known to those skilled in the art as being the type which eliminates the serial carry or borrow from the counter by providing AND circuits, such as the diode AND circuits described in FIGURE 1, having inputs from all lower order digit positions to provide an input trigger pulse to a given digit position. Thus for an input trigger to be provided to flip-flop 76, flip-flops 78, 80 and 82 must all be in the "1" state and a count pulse on line 86 must be provided to satisfy the logic requirements of AND circuit 84. The progression of the count occurs in the usual manner.

In FIGURE 2 count pulses 88 periodically are applied to line 86 of FIGURE 4 to alternate respectively the states of flip-flop 82 as indicated by voltage wave 90. The more significant digit positions alternate states as indicated by waves 92, 94 and 96. At the time denoted by dash line 98, which time corresponds to the occurrence time of a leading edge of one of count pulses 88 in FIGURE 2, waves 90 and 92 change from a positive voltage while wave 94 changes to a positive voltage. It is well known that in changing voltage levels the change does not occur instantaneously, rather there is usually some delay in the change such as caused by current saturation and high impedance effects. Thus the change in voltage waves 90 and 92 may be delayed as indicated by dotted lines 100 and 102, respectively.

Upon applying the waves of FIGURE 2 to the counter of FIGURE 4 when circuits 76—82 are conventional, and then especially considering the input signals to AND circuit 84, it is seen that with waves 90 and 92 being delayed in changing to a negative voltage while wave 94 is at a positive voltage, AND circuit 84 may be sufficiently satisfied to pass at least a "runt" or substandard pulse to flip-flop 76, thereby causing flip-flop 76 to prematurely change state, which would move leading edge 104 to dash line 98, to give a false count. Thus the counting is sensitive to switching and signal transmission times of the various bistable elements comprising the counter.

Figure 3:
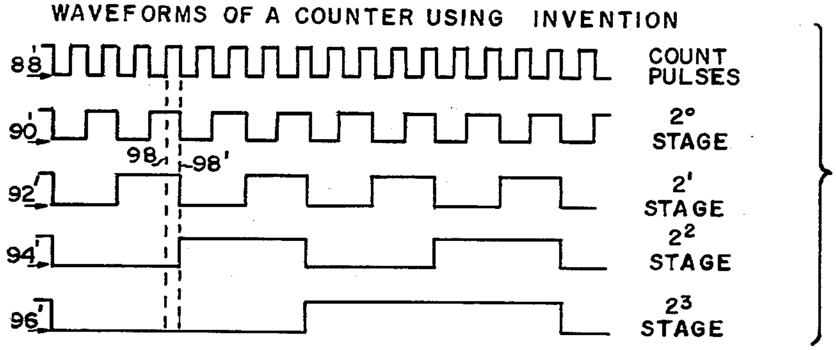
FIGURE 3 is a sketch of waveforms associated with a counter consisting of stages made in accordance to the teachings of this invention.
Figure 4:
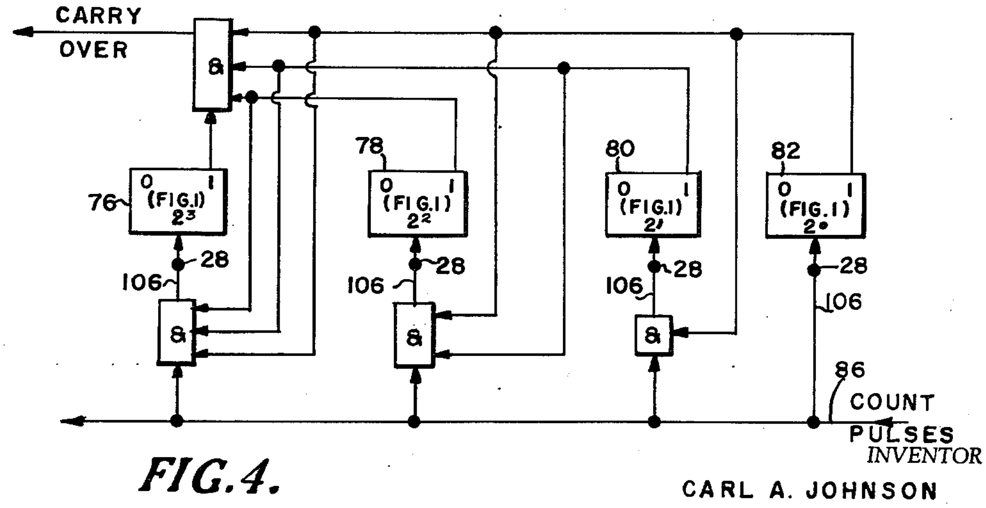
FIGURE 4 is a block diagram of a counter utilizing counting stages of this invention.

The voltage waves illustrated in FIGURE 3 are idealized waves taken from a counter having the logic of the counter illustrated in FIGURE 4, but utilizing bistable counting elements built according to the teaching of this invention. Count pulses 88 are again applied to line 86 to advance the counter. Circuits 76, 78, 80 and 82 each now are comprised of the circuitry shown in FIGURE 1 including flip-flop 10, circuits 30 and 32, and AND gates 24 and 26, along with the emitter followers 11 and 13 if desired. Input terminal 28 of FIGURE 1 is in each of the trigger input lines 106 of FIGURE 4. In FIGURE 3, time marker 98' indicates when voltage waves 90' and 92' change form positive to negative indication and wave 94' changes from negative to positive indication. Because none of the bistable counting circuits 76—82 when constructed in accordance with FIGURE 1, will ever begin to change state until cessation of the existing count pulse, there can be no premature change in the disablement status of AND circuit 84 (or of the other AND circuits of the counter) as described for the waves of FIGURE 2. Switching action of all the bistable counting elements occurs simultaneously but after cessation of a trigger pulse 88. Therefore, even if there is a slight delay in the switching action, this delay occurs during the absence of a count pulse preventing AND circuit 84, or the others, from being satisfied. Thus the possibility of obtaining a false count is greatly reduced if not nullified.

It is obvious to those skilled in the art that various types of transistors may be substituted for the PNP's shown in the embodiment of FIGURE 1, and that the polarity of all signals would be reversed for similar circuit operation when using complementary transistors.

Thus it is apparent that there is provided by this invention systems in which the various objects and advantages herein set forth are successfully achieved.

Modifications of this invention not described herein will become apparent to those of ordinary skill in the art after reading this disclosure. Therefore, it is intended that the matter contained in the foregoing description and the accompanying drawings be interpreted as illustrative and not limitative, the scope of the invention being defined in the appended claims.

What is claimed is:

1. In a multivibrator circuit having at least one input and at least one output at which there may be exhibited two discrete conditions at least one of which is in response to an input signal only when the input signal has at least a predetermined amplitude, the improvement comprising a condenser coupled to said input, means releaseably clamping said condenser to a predetermined potential, means for releasing the effect of the clamping means for at least a predetermined time, means for charging said condenser when said clamping means is released, the charge on said condenser as so developed being of such polarity as to be ineffective to cause said multivibrator circuit to change from the other of said two conditions to said one condition, the reclamping by said clamping means being effective to discharge said condenser and cause an input signal which will so change the condition of said multivibrator if said clamping means was released for a time sufficient to allow the change on said condenser to build up to a point sufficient to cause an input signal of at least said predetermined amplitude.

2. In a circuit having at least one control element which may be triggered by an input signal only if the input signal has at least a predetermined amplitude, the improvement comprising storage means changeable at least between two predetermined conditions only if a given length of time elapses, said storage means being normally in a given one of said conditions and then incapable of supplying said input signal but when in its other predetermined condition being capable of supplying an input signal of said predetermined amplitude, and means operatively responsive (1) to the leading edge of a trigger signal for changing said storage means from said one condition to its said other condition only when allowed to operate for said given time, and (2) to at least the trailing edge of said trigger signal for changing said storage means back to said one condition to effect from the storage means an input signal the amplitude of which is then at least said predetermined amplitude only if the trigger signal has existed for said given length of time so as to allow the storage means to change to its said other condition.

3. In a circuit having at least one control element which may be triggered by an input signal only when it has at least a predetermined amplitude, the improvement comprising a condenser coupled to said control element, means for charging said condenser, means for discharging said condenser, and means operative in response to a trigger signal for causing said charging and discharging means to operate sequentially, one of said charging and discharging means being normally operative while the other is normally inoperative, the leading edge of said trigger signal being effective to reverse the normal operation of each of said charging and discharging means and at least the trailing edge of said trigger signal being effective to revert the operating conditions of the charging and discharging means back to normal, the arrangement being such that the charge on said condenser at the time of the reverting is sufficient to cause an input signal having at least said predetermined amplitude only if said trigger signal has existed for at least a predetermined time.

4. In a circuit having at least one control element which may be triggered by an input signal only if the input signal has at least a predetermined amplitude and a given polarity, the improvement comprising storage means gradually changeable at least from a first predetermined limited condition to a second predetermined limited condition only if a given length of time elapses. said storage means being normally in said first condition and at that time incapable of supplying an input signal of said given polarity but when in its second condition being capable of supplying an input signal of said predetermined amplitude and given polarity, means operatively responsive (1) to the leading edge of a trigger signal for causing said storage means to start gradually changing from its first condition toward its second condition, and (2) to at least the trailing edge of said trigger signal for causing the storage means to start changing back to said first condition to effect from the storage means an input signal having said given polarity and an amplitude which, at least up to said predetermined amplitude, is dependent upon the length of time said trigger signal exists, the arrangement being such that said input signal has said predetermined amplitude only if the trigger signal exists for said given length of time.

5. For use with a utilization circuit which may be triggered only by an input signal which has at least a predetermined amplitude, the improvement comprising means responsive to a trigger signal for causing said input signal and allowing the input signal to attain said predetermined amplitude and substantially no more or less as long as the trigger signal when beginning at time $t_0$ lasts to at least time $t_1$ and even though the trigger signal endures to time $t_2$ or longer, where times $t_0$, $t_1$, and $t_2$ are respectively later occurring, said means including: means for generating and gradually changing said input signal to an amplitude limit of said predetermined amplitude in substantially no less time than $(t_1-t_0)$, means responsive to the trigger signal at time $t_0$ for starting said generating means, and a timing circuit operative from time $t_0$ in response to, and only during the existence of, said trigger signal for causing the generation of said input signal to stop at time $t_2$ or earlier if the trigger signal ends earlier but not later if the trigger signal ends later.

6. For use with a utilization circuit which has two control elements for respectively receiving first and second input signals for triggering said circuit alternately between two stable states only if the input signals have at least a predetermined amplitude, the improvement comprising first means for generating said first input signal, second means for generating said second input signal, two means respectively associated with said first and second generating means and respectively responsive to the leading edge of a trigger signal received thereby for starting the associated generating means and to at least the trailing edge of a trigger signal received thereby for stopping the associated generating means, and means for changing the amplitude of a generated input signal to said predetermined amplitude in no less than a given length of time, the arrangement being such that said utilization circuit may be continuously triggered between its two states by successively received trigger signals which exist for at least said predetermined time.

7. The improvement as in claim 6 and further including means for initially receiving said trigger signals and for gating them to one or the other of said two means in accordance with the state of said utilization circuit.

8. An electronic circuit comprising a bistable multivibrator having two inputs for respectively receiving first and second input signals for triggering the multivibrator alternately between its two stable states only if the received input signals have at least a predetermined amplitude, first and second storage means respectively coupled to said inputs, each of said storage means being changeable at least from a first predetermined condition to a second predetermined condition only if a given length of time elapses from the receipt of a first change-condition signal, each of said storage means being normally in said first condition and at that time incapable of supplying said input signal but when in its second condition being capable of supplying an input signal of said predetermined amplitude, and two means respectively for said storage means and respectively responsive to the leading edge of a trigger signal received thereby for providing said first change-condition signal to its respective storage means, and operatively responsive at least to the trailing edge of a trigger signal received thereby for providing a second change-condition signal which causes the respective storage means to change back to said first condition and to effect from the storage means an input signal the amplitude of which is then said predetermined amplitude only if the trigger signal has existed for said given length of time.

9. A circuit as in claim 8 and further including means for initially receiving a trigger signal and gating it to one or the other of said two means in accordance with the state of said multivibrator.

10. An electric circuit comprising a bistable multivibrator having two inputs for respectively receiving first and second input signals for triggering the multivibrator alternately between its two stable states only if the received input signals have at least a predetermined amplitude, first means for gradually generating and storing said first input signal, second means for gradually generating and storing said second input signal, first switch means normally operative to keep said first means inoperative but responsive to the leading edge of a received trigger signal for causing the said first means to begin generating and storing said first input signal, said first switch means being also responsive at least to the trailing edge of a received trigger signal for stopping the generation of said first signal and causing the generated first input signal as stored to be delivered to the associated multivibrator input, whereby said multivibrator changes state only if the trigger signal as received by said first switch means has existed for a time sufficient to allow said first means to gradually increase the amplitude of said first input signal to said first predetermined amplitude, second switch means normally operative to maintain the second generating and storing means inoperative but responsive to the leading edge of a received trigger signal for making said second means operative, the second switch means being also responsive to at least the trailing edge of a received trigger signal for stopping the generation of said second input signal and causing it to be delivered to the other multivibrator input whereby the multivibrator changes states only if the trigger signal as received by said second switch means existed for a time sufficient to allow the said second means to gradually generate and store an input signal which has at least said predetermined amplitude.

11. A circuit as in claim 10 and further including means for limiting the amplitude of each of said input signals to said predetermined amplitude.

12. A circuit as in claim 11 and further including two timing circuits, one for each of said switch means, for stopping the generation of signals a predetermined time after it has reached said predetermined amplitude if the trigger signal received by the associated switch means endures beyond said predetermined time.

13. A circuit as in claim 10 and further including means for initially receiving a trigger signal and gating it to one or the other of said switch means in accordance with the existing state of said multivibrator.

14. A circuit as in claim 10 and further including means for initially receiving a trigger signal and gating it to one or the other of said switch means in accordance with the existing state of said multivibrator, said gating means being coupled to each of the switch means by respective timing circuits the time constants of which are greater than the time which it takes the respective generating means to generate its input signal to said predetermined amplitude.

15. A circuit as in claim 14 and further including means for limiting each of the input signals in amplitude to said predetermined amplitude.

16. A circuit as in claim 10 wherein each of the generating and storing means includes a condenser and means for charging the condenser.

17. An electronic circuit comprising a bistable multivibrator including two transistors each having an input and an associated output for alternately exhibiting two different voltage conditions in response to first and second input signals received at said inputs respectively when said input signals have at least a predetermined amplitude, two condensers coupled respectively to said inputs, means for charging each of said condensers, third and fourth transistors respectively coupled to said condensers, means for making said third and fourth transistors normally conductive thereby clamping the voltage across each of said condensers to a predetermined potential and preventing said charging means from being operative, two gates respectively having their outputs coupled to the inputs of said third and fourth transistors, each of the gates being coupled to a different one of the outputs from said multivibrator transistors and being coupled in common to receive a trigger signal for gating the trigger signal to one or the other of said third and fourth transistors in accordance with the existing voltage condition at the multivibrator transistor outputs, the leading edge of a so gated trigger signal being operative to cause the tarnsistor switch receiving same to become non-conductive thereby allowing said charging means to charge the condenser coupled to the non-conductive transistor switch, at least the trailing edge of a gating trigger signal being operative to cause the transistor switch receiving same to become conductive again thereby discharging the associated condenser and causing an input signal from the condenser, and means for limiting the amplitude to which either of the condensers may charge to said predetermined amplitude, the arrangement being such that either of said condensers may charge to said predetermined amplitude only if the trigger signal effectively causing the condenser to receive a charge exists for a time sufficiently long to allow the condenser to charge up to said predetermined amplitude.

18. A circuit as in claim 17 and further including two timing circuits for respectively coupling the gates for their respective transistor switches and for determining the maximum time the respective transistor switches are non-conductive if the trigger signal endures longer than such time.

19. In an electronic pulse counter which includes a plurality of bistable counting circuits each having a single input terminal and at least one output terminal with the output terminals all being coupled to an AND circuit, and wherein the pulses to be counted are coupled directly to the input terminal of the lowest order counting circuit and to the input terminals of the remaining counting circuits via other AND circuits respectively coupled to the other counting circuits and to the outputs of each of the lower order counting circuits, the improvement wherein each of the bistable counting circuits comprises a bistable multivibrator requiring first and second input signals for respectively alternating the multivibrator between its two stable states, means for gradually developing and storing said first input signal in resopnse to the leading edge of a trigger signal, means responsive to at least the trailing edge of said trigger signal for causing the stored first input signal to be delivered to said multivibrator, means for gradually developing and storing said second input signal in response to the leading edge of a gated trigger signal, means responsive to the trailing edge of a gated trigger signal received thereby for causing the stored input signal to be delivered to said multivibrator, and means coupled to said trigger signal input for gating a received trigger signal to effect the first input signal or the second input signal in accordance with the existing state of the multivibrator.

20. An electronic pulse counter comprising a plurality of bistable counting circuits each having an input for receiving a trigger signal and at least one output, an AND circuit coupled to each of said outputs, a plurality of other AND circuits respectively coupled at their outputs to the inputs of said bistable circuits except the lowest order circuit for providing trigger signals thereto, each of said other AND circuits having an input from the output of each lower order bistable circuit, the pulses to be counted being coupled to another input of each of said other AND circuits and directly to the trigger signal input of said lowest order counting circuit, each of said counting circuits including a multivibrator changeable between two stable states upon receipt of successive trigger signals at least when the trigger signals have at least a predetermined amplitude, and means for each multivibrator responsive to a trigger signal for allowing the associated multivibrator to change its state only following the occurrence of the trailing edge of said trigger signal.

References Cited in the file of this patent

UNITED STATES PATENTS

| | | |
|---|---|---|
| 2,883,562 | Graham et al. | Apr. 21, 1959 |
| 2,885,574 | Roesch | May 5, 1959 |
| 2,906,894 | Harris | Sept. 29, 1959 |
| 2,909,678 | Jensen | Oct. 20, 1959 |
| 2,912,575 | Hurley | Nov. 10, 1959 |
| 2,918,587 | Rector et al. | Dec. 22, 1959 |
| 2,923,838 | Slobodzinski et al. | Feb. 2, 1960 |